US008728337B2

(12) United States Patent
Brancher et al.

(10) Patent No.: US 8,728,337 B2
(45) Date of Patent: May 20, 2014

(54) POSITIVE DISPLACEMENT PUMPING CHAMBER

(71) Applicant: SPTS Technologies Limited, Newport (GB)

(72) Inventors: Carl Brancher, Avergavenny (GB); John MacNeil, Vale of Glamorgan (GB); Robert Trowell, Thornbury (KR)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 13/773,711

(22) Filed: Feb. 22, 2013

(65) Prior Publication Data

US 2013/0186857 A1 Jul. 25, 2013

Related U.S. Application Data

(62) Division of application No. 12/089,899, filed as application No. PCT/GB2006/003766 on Oct. 11, 2006, now abandoned.

(60) Provisional application No. 60/724,938, filed on Oct. 11, 2005.

(30) Foreign Application Priority Data

Oct. 12, 2005 (GB) .................................. 0520694.1

(51) Int. Cl.
*H01L 21/306* (2006.01)

(52) U.S. Cl.
CPC .................................. *H01L 21/306* (2013.01)
USPC .......................................................... 216/58

(58) Field of Classification Search
None
See application file for complete search history.

(56) References Cited

U.S. PATENT DOCUMENTS

2004/0140054 A1* 7/2004 Johnson .................. 156/345.43
2004/0198062 A1* 10/2004 Ye et al. ....................... 438/706

* cited by examiner

*Primary Examiner* — Shamim Ahmed
*Assistant Examiner* — Bradford Gates
(74) *Attorney, Agent, or Firm* — Volentine & Whitt, PLLC

(57) ABSTRACT

A method is for processing a substrate. The method includes placing the substrate in a process volume and introducing a process gas or vapor into the process volume and/or subsequently removing gas or vapor from the volume. The step of introducing and/or removing the gas is at least partially performed by moving a movable wall to change the process volume in an appropriate sense.

4 Claims, 4 Drawing Sheets

Positive displacement chamber cycle

Single cycle of piston/valves within a single complete metal oxide deposition cycle shown

| | piston | piston | metal gas | | top purge gas | | oxidant gas | | Bottom pumping |
|---|---|---|---|---|---|---|---|---|---|
| | location | moving | inlet | outlet | inlet | outlet | inlet | outlet | |
| wafer loading, pump down | loading | | closed | closed | open | closed | closed | open | |
| Piston elevation to evacuate | processing | up | closed | closed | closed | open | closed | open | |
| Purde cycle | processing | down | closed | closed | **open** | closed | closed | open | single cycle |
| | processing | up | closed | closed | closed | **open** | closed | open | |
| Metal Gas | processing | down | **open** | closed | closed | closed | closed | open | |
| | processing | up | closed | **open** | closed | closed | closed | open | |
| Purge | processing | down | closed | closed | **open** | closed | closed | open | |
| | processing | up | closed | closed | closed | **open** | closed | open | |
| Oxidant | processing | down | closed | closed | closed | closed | **open** | open | |
| | processing | up | closed | closed | closed | open | closed | open | |

Multiple cycles of the piston/valves is allowed as necessary

*Fig. 4*

POSITIVE DISPLACEMENT PUMPING CHAMBER

CROSS REFERENCE TO RELATED APPLICATIONS

This is a Divisional of U.S. patent application Ser. No. 12/089,899, filed Jun. 10, 2008, which is a United States National Stage Application filed under 35 U.S.C. §371 of PCT Patent Application Serial No. PCT/GB2006/003766 filed on Oct. 11, 2006, which claims the benefit of and priority to Great Britain (GB) Patent Application Serial No. 0520694.1 filed on Oct. 12, 2005, and U.S. Provisional Patent Application Ser. No. 60/724,938 filed on Oct. 11, 2005, the disclosures of all of which are hereby incorporated by reference in their entirety.

BACKGROUND

The present invention describes an apparatus for the deposition and/or removal of thin layers of materials on or from a substrate such as a silicon wafer.

A number of advanced deposition and etching processes make use of discrete steps for the formation of a thin film or the etching of deep structures. These steps are preferably performed in one process chamber (either batch or single wafer).

By way of example, Atomic Layer deposition (ALD—also known as atomic layer epitaxy) is a chemical vapor deposition process in which self-limiting surface reactions produce extremely conformal coatings. There is a growing requirement to increase equipment productivity for ALD and similar processes for example to form very thin layers high dielectric constant (k) films such as $HfO_2$ or alumina. For the ALD of a layer such as Aluminum oxide a reactant gas containing Aluminum such as trimethyl aluminum $Al(CH_3)_3$ is firstly introduced into a chamber containing the substrate(s) such that a monolayer of this gas adheres to and in many cases saturates the surface. A purge is then necessary by pumping only or with an inert (to this process) gas such as nitrogen or hydrogen to remove all but this monolayer of gas from the chamber. Then an oxidizer, such as water vapor, is flowed into the chamber and a surface reaction with the trimethyl aluminum takes place forming a monolayer of aluminum oxide. Excess oxidizer and reaction by-products are then pumped away and the chamber purged and the cycle repeated until the desired film thickness achieved.

The cycle time therefore=Exposure A+Purge A+Exposure B+Purge B

Purge is used throughout to mean the sufficient removal or dilution of the reactant. This may be achieved by pumping alone or by pumping and flowing an inert (Purge) gas or any sequence of the two as is well known in the field.

Where A and B represent the precursors from which the deposited film is derived. This is example is given simply by way of example and a review of the field will give many further examples of such step-wise deposition processes.

Whilst this binary process produces high quality films and is relatively insensitive to other process parameters it is very slow, as the layers are built up monolayer at a time.

The necessary exposure time is very short so a known attractive approach to increasing the speed of film growth is to decrease exposure times. Whilst exposure times may be reduced to very short periods e.g. sub 1 second, it is a critical requirement that the process chamber is adequately purged after the precursor exposure steps.

Presently there is no method of reducing the purge times to those as short as the exposure times and in an otherwise optimized process perhaps 75% of the total cycle time is spent (unproductively) purging the chamber.

SUMMARY

A method of rapidly extracting the process chamber gaseous contents would therefore be advantageous as it would increase the productivity of equipment for ALD and other stepwise processes.

From one aspect the invention consists in apparatus for processing a substrate in a process cycle including a chamber for receiving a substrate in a process volume and a moveable wall displaceable to vary the process volume in accordance with the process cycle.

The apparatus may include an exhaust outlet and the moveable wall may be moveable to reduce the process volume to purge gas from the process volume through the exhaust outlet during a purge part of the process cycle. In a particularly preferred embodiment there are a plurality of exhaust valves operable in respect purge parts of the process cycle.

Similarly the apparatus may include an inlet for process gas and the moveable wall may be moveable to draw process gas through the inlet during the process part of the process cycle. There may be a plurality of inlet valves for respective process gases.

There may also be an inlet for purge gas and the purge gas inlet may be constituted by a process gas inlet.

The ratio of the largest and smallest process volumes defined by the moveable wall may be between about 5:1 and 100:1. In a particularly preferred arrangement the volume ratio is about 10:1.

The compression ratio in the process volume resulting from the movement of the wall may be about between 5:1 and about 100:1 and 10:1 is particularly preferred.

The moveable wall may act as or carry a substrate support, in which case the moveable wall may additionally be moveable between a substrate load/unload position and a process chamber defining position.

The moveable wall may be located in an extension of the process chamber, in which case the chamber and the extension may have a common housing. Additionally or alternatively the extension may be adjacent the chamber.

In an alternative embodiment the apparatus may include a substrate support and the moveable wall may be generally opposite to the substrate support. In this case the apparatus may include a fixed housing extending around the substrate support to define a process chamber together with the moveable wall and support. The moveable wall and/or housing may include a plurality of parts, at least two of which are relatively moveable to allow loading of a substrate onto the substrate support.

In any of the above cases the wall may be a piston.

In another aspect the invention may consist in a method of processing a substrate including placing the substrate in a process volume and introducing a process gas or vapour into the process volume and/or subsequently removing gas or vapour from the volume wherein the step of introducing and/or removing the gas is at least partially performed by moving a moveable wall to change the process volume in an appropriate sense.

The steps of introducing and removing may be sequentially repeated.

The process performed may be chemical vapour deposition such as atomic layer deposition or dry etching or any other suitable process.

The afore mentioned apparatus may include a controller for operating that apparatus in accordance with any of the above defined methods.

In a further aspect the invention consists in a substrate process chamber with a moving wall such as a piston wherein the process volume is changed to increase the efficiency of exposure to, or purging of precursors.

The moving wall may be a piston or diaphragm and may move in cooperation with the timing of an inlet or outlet valve.

Inlet and exhaust valves, (which may be piston ported) may be used for the inlet and outlet of the reactants and purge gas. By this means the vapor or gas within the chamber may be positively displaced by moving the wall to increase the speed of their removal and/or their volume decreased (pressure increased) to speed evacuation from the process chamber. Also, by being able to increase the process volume the pressure of a fixed mole volume of gas may be reduced and thereby the speed of distribution of a gas charge across a substrate be increased.

In another aspect the invention consists of a method of removing or distributing gas or vapor contents' from or within a chemical vapor deposition reaction chamber by moving a wall such that the chamber volume is changed.

By changing the process volume the pressure of a fixed quantity of gas is changed and it is then possible to exploit different gas flow dynamic characteristics at different steps of the step-wise process. So, for example, the chamber pressure can be rapidly reduced by rapidly increasing its volume by rapidly moving the wall. Similarly a fixed gas charge may be removed from the chamber more quickly for any given conductivity pipe work by reducing its volume/increasing its pressure. Additionally the moving of a wall to reduce the chamber volume positively displaces the fluid contents of the chamber.

Exploiting the different gas flow dynamics at different pressures also allows for advantageous changes in inlet and outlet valving and entry and exit points and may allow for smaller exhaust valves and pipe work and allow for simpler gas injection systems with fewer gas injection holes.

Rapid pump-purge cycles are also achievable by the use of this moving wall and in a further aspect of the invention there is provided at least 2 chamber exhaust ducts to segregate the. first precursor exhaust from the second precursor exhaust thereby enabling precursor recycling.

Whilst chemical vapor deposition, and in particular atomic layer deposition processes have been described, the apparatus and methods may also be applied to other step-wise processes such as in the field of dry etching, including plasma etching of substrates and in particular composite deposition/etch processes such as the deep etching of silicon, such as the, 'Bosch' process.

The substrate may be a silicon or compound wafer, glass, polymer or disc drive head and the structures formed may be part of microelectronic, magnetic, radio or photonic devices such as memory or logic devices, displays, emitters, sensors and storage devices including discs or read or write heads.

Although the invention has been defined above, it is to be understood it includes an inventive combination of the features set out above or it the following description.

BRIEF DESCRIPTION OF THE DRAWINGS

The invention may be performed in various ways and specific embodiments will now be described, by way of example with reference to the following drawings in which:

FIG. 4 is a matrix indicating a piston valve sequence for the deposition of metal oxide.

DETAILED DESCRIPTION OF EMBODIMENTS

Figure 1:
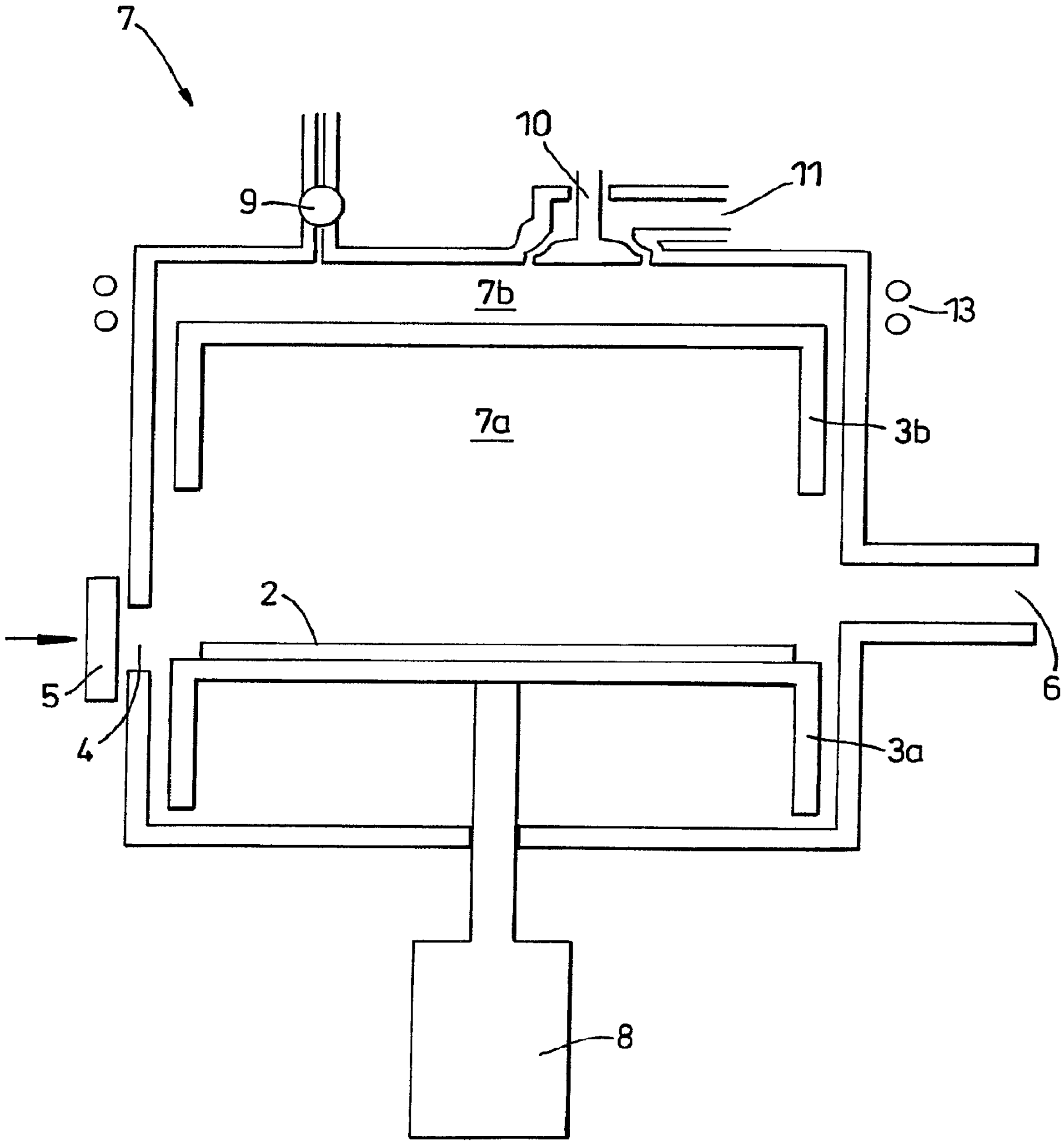
FIG. 1 is a diagram of an embodiment of the invention.

A substrate processing system is shown in FIG. 1 generally at 1. A substrate 2 lies upon a piston 3 shown in both a loading position 3*a* and in a processing position 3*b*. A substrate is loaded via a port 4 with a door 5 if required. The loading area 7*a* and or the whole chamber 7 may be pumped out via vacuum exhaust pipe 6 connected to a pump (not shown) and this pipe work may provide vacuum pumping at the underside of the piston 3 when at its processing position 3*b* (the piston effectively valving off vacuum exhaust 6 from the process volume 7*b*).

Linear drive mechanism (such as a crank) shown diagrammatically at 8 lifts the piston and substrate in the chamber such that a process volume 7*b* of the chamber is defined with poor gas conduction. between the piston and the walls of the chamber. The linear drive then moves the piston up and down at programmed speeds and distances and gas or vapours are input to the chamber via inlet valves 9 and exhausted via outlet valves 10 where the exhausted gas may pass via pipe 11 to an extract or waste management system that most preferably may recycle at least part of one process gas back to valve 9.

A purge gas inlet (not shown) may also be provided to provide purge gas to the underside of the piston in its processing position. It should be understood that the exhaust valve 10 may be optional, depending on the vacuum pumping arrangement. Its main function may be to stop exhaust being sucked back into the process chamber when the piston rapidly expands the chamber volume. It may also be necessary when the piston is moved to reduce the process volume.

It should be understood that the piston 3 may rotate or oscillate rotationally if desired to improve process and/or sealing of the piston to the chamber wall. The piston may include a wafer clamp means such. as an electrostatic force or clips or clamping ring and may be flat or recessed as is desired.

Whilst the chamber is shown diagrammatically as a unit it may be made of many parts of differing materials and in particular may have a dielectric wall about process volume 7*b*. Radio frequency power may be applied e.g. by antenna 13 to enable plasma processing such as a cleaning process for the substrates or the chamber or during deposition or etching of a substrate.

Figure 2:
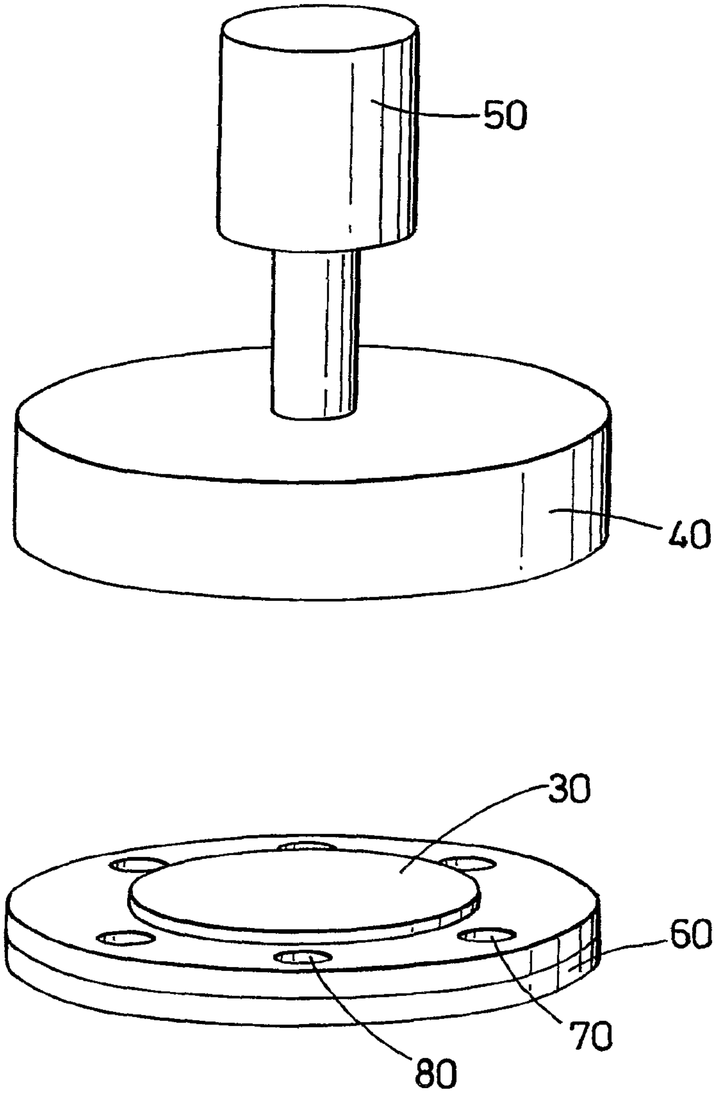
FIG. 2 is a diagram of parts of another embodiment of the invention.

FIG. 2 shows parts for an alternative embodiment of the invention where the substrate platen 30 does not rise and fall during processing and instead an opposing closed ended cylinder 40 driven by a linear drive shown diagrammatically at 50 achieves the positive displacement of gas or vapour. Cylinder 40 (or an upper part thereof) is lifted to allow a substrate to be placed upon the platen 30 that may advantageously be controlled to a process temperature and also has a method of clamping the substrate such as electrostatically or mechanically. The cylinder (or upper part thereof) then lowers about a lower assembly 60 that surrounds the platen and contains inlet(s) 70 and outlet(s) 80 for the process and purge gasses or vapours. There is a low conductance path (or gas seal) between complete cylinder 40 and lower assembly 60 when the cylinder is in the lowered position. The cylinder 40 may consist of 2 parts, one of which is permanently about the lower assembly e.g. mounted on a bearing such that the upper part of the cylinder lowers and engages and seals with the lower cylinder part. By driving the cylinder 40 up and down about lower assembly 60 positive gas displacement is achieved within the working volume of the chamber defined by the cylinder 40 and the lower assembly 60 and containing gas inlets 70 and outlets 80. The cylinder 40 is contained more generally within a vacuum or controlled atmosphere 90.

The advantage of this embodiment is that the substrate platen is not moved and thereby complex platens such as heated or chilled ceramic platens with tight temperature control and electrostatic clamping are more easily built.

It should also be understood that the piston or moving wall need not oppose the substrate but may be in any location such that its movement makes a significant change in the process volume.

It will also be understood that the more remote the piston is from the actual chamber, the larger the effective process volume becomes as the connection between the chamber and the piston effectively become part of the process volume. This means that the volume swept by the piston needs to increase in order to effect suitable pressure changes in the process volume and in practice it will usually be necessary for the piston to be either within the chamber or substantially adjacent to it.

Figure 3:
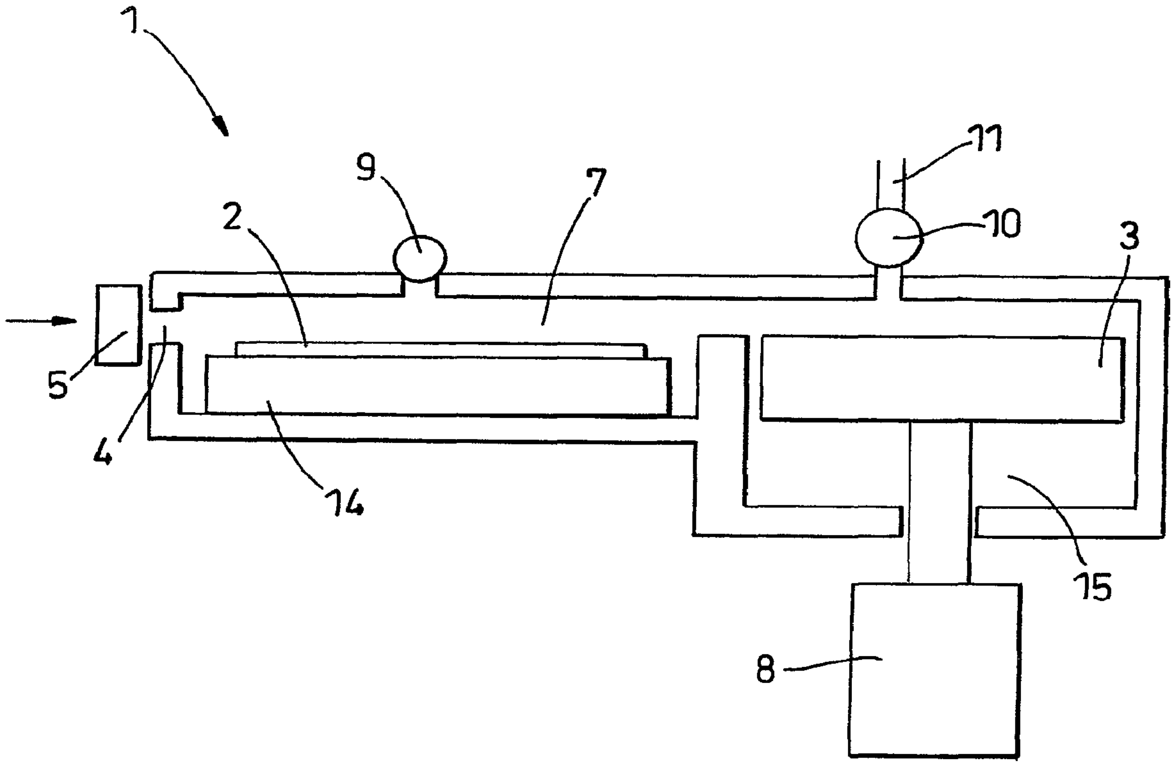
FIG. 3 is a diagram of another embodiment of the invention.

FIG. 3 shows another embodiment where the piston 3 (driven linearly by a drive mechanism 8) is closely coupled to the substrate 2 lying upon a platen 14. The substrate is loaded via a port 4 with a door 5 in the chamber 7. Gas inlet valve 9 and outlet valve 10 are provided where there may be more than one inlet and/or outlet valve to separate the input precursors and if a separate exhaust 11 is provided for one of the precursors then this may take the exhaust to a recovery and recycling system (not shown). The underside area 15 of the piston may be either large compared to the process volume 7 and/or connected to inlet/outlet means to allow free movement of the piston.

The piston may move up (reduced process volume) one or more times to compress and/or expel chamber fluid contents and may move down (increase process volume) one or more times, to reduce process volume pressure or draw in or fill the chamber. The movement of the piston may create turbulence and/or reduce pressure and thereby increase the speed of gas injected non-uniformly to move about the chamber and thereby coat the substrate surface more uniformly.

The piston or wall may move rapidly and affect a chamber purge in less than one second.

The opening and closing of valves may be timed to the piston movement by mechanical or electrical or electronic means. The piston may be on a crank or may be driven such as by a linear motor. The speed and distance of travel and number of strokes of the piston may be the same or be varying for the different steps of the cyclic process as is found necessary to optimize the process. FIG. 3 shows, by way of example, a piston/valves sequence matrix useable in a metal oxide deposition process.

In other cases the piston may only move for a purge step such as between oxidation and the metal containing precursor introduction to the chamber.

The reactants may be vaporized and injected, or pumping into the chamber as a vapor or they may be atomized or vaporized at the point of dispensation into the chamber and it is to be understood that the use of a purge gas is optional.

The reactants can be energized if desired before entering the chamber such as by heat, radio, light or some other electromagnetic frequency.

The reactants and purge gasses may be recovered, filtered, purified and made up with fresh reactant and recirculated to reduce consumption.

The compression ratio of the apparatus will determine the peak processing pressure and this may be varied between gases, cycles and throughout a deposition as is desirable particularly if a linear motor drive is chosen for the piston. Pressure, as well as temperature and other process requirements, may be sensed and the results fed back to a control system to provide process control.

The face opposing the substrate may be shaped to improve gas distribution to improve process or efficiency characteristics such as uniformity of deposition and efficiency of gas consumption.

By way of example for a 300 mm diameter chamber with a working spacing of 10 mm that compresses to 1 mm spacing.

Representative Values:

Time for chamber wall to move between 10 mm and 1 mm spacing: 0.1 second

Process spacing: 10 mm

Process pressure: 1 torr

For a 1 torr process pressure at the 10 mm spacing then when compressed to a 1 mm spacing there will be approximately 70 ccs of gas at 10 torr pressure.

Vacuum simulation software tells us that it will take 0.22 secs to exhaust to 100 mT with an exhaust gas outlet of 0.5 inches diameter. This assumes that the exhaust is only open when the chamber is compressed to 1 mm whereas evacuation will be faster if the exhaust valve is open throughout this compression stroke. Moving the chamber spacing back to 1 Omm from 1 mm their drops the pressure by a factor of 10 to 10 mT.

With 0.2 secs for piston movement (up and down)and 0.22 secs exhaust time at 1 mm spacing there is a total time of 0.42 secs to take the chamber from 1 Torr to 10 mT at 10 mm spacing by this combination of compression and expansion and evacuation.

Without moving the chamber wall and simply pumping by opening the same size exhaust will take 3 seconds computed by the same software model to the same assumptions.

For superior purging of a chamber a purge gas may be introduced as well as pumping. This procedure may also advantageously be carried out with a changing in chamber volume as herein described.

If 100:1 dilution is not enough and 1000:1 is desired, then pumping the uncompressed volume to 1 mTorr takes an extremely long time even with very large diameter pipework and valves and very high speed low pressure pumps. By just pumping, each extra decade in base pressure of a reactant increases time in a very non-linear fashion. But with a positive displacement chamber the time to get another decade in base pressure is linear. So, for example, twice the time, i.e. 0.84 seconds provides 10000:1 dilution . . . 1.26 seconds provides 1000000:1 . . . etc.

What is claimed is:

1. A method of processing a substrate comprising:

placing the substrate in a process space delimited by a movable wall;

introducing a process gas or vapour into the process space;

carrying out a process on the substrate in the process space using the process gas or vapor; and removing gas or vapour from the process space, and wherein at least one of the introducing and the step of removing of the gas or vapour is effected at least in part by moving the movable wall to change the volume of the process space and thereby draw the process gas or vapour into the process chamber or expel gas or vapour from the process chamber, wherein the process gas or vapor is introduced into the process space a number of discrete times, gas or vapour is removed from the process space a number of discrete times each occurring after the process gas or vapour has been introduced into the process chamber, whereby the introducing and removing of the gas or vapour are sequentially repeated, and the introducing of the process gas or vapour and the removing of the gas or vapor are effected at least in part by moving the movable wall to sequentially and repeatedly increase and decrease the volume of the process space.

2. A method as claimed in claim 1 wherein the process is chemical vapour deposition.

3. A method as claimed in claim 1 wherein the process is atomic layer deposition.

4. A method as claimed in claim 1 wherein the process is dry etching.

* * * * *